United States Patent
Cauvet et al.

(10) Patent No.: US 7,960,189 B2
(45) Date of Patent: Jun. 14, 2011

(54) METHOD OF MANUFACTURING A SYSTEM IN PACKAGE

(75) Inventors: Philippe L. L. Cauvet, Caen (FR); Herve Fleury, Caen (FR); Fabrice Verjus, Creully (FR)

(73) Assignee: NXP B.V., Eindhoven (NL)

( * ) Notice: Subject to any disclaimer, the term of this patent is extended or adjusted under 35 U.S.C. 154(b) by 29 days.

(21) Appl. No.: 11/995,636

(22) PCT Filed: Jul. 18, 2006

(86) PCT No.: PCT/IB2006/052451
§ 371 (c)(1),
(2), (4) Date: Nov. 25, 2008

(87) PCT Pub. No.: WO2007/010480
PCT Pub. Date: Jan. 25, 2007

(65) Prior Publication Data
US 2009/0148966 A1      Jun. 11, 2009

(30) Foreign Application Priority Data
Jul. 19, 2005   (EP) .................................... 05300600

(51) Int. Cl.
*G01R 31/26* (2006.01)
*G01R 27/26* (2006.01)
*G01R 31/00* (2006.01)
*H01L 21/66* (2006.01)

(52) U.S. Cl. .................. 438/15; 438/4; 438/14; 438/16; 438/17; 324/750.3; 702/58; 702/118

(58) Field of Classification Search .......... 438/4, 14–18; 324/763, 765; 702/58, 118
See application file for complete search history.

(56) References Cited

U.S. PATENT DOCUMENTS

| | | | | |
|---|---|---|---|---|
| 4,937,203 A * | 6/1990 | Eichelberger et al. | .......... | 438/15 |
| 5,036,479 A * | 7/1991 | Prednis et al. | ................ | 702/121 |
| 5,907,492 A * | 5/1999 | Akram et al. | ................. | 700/121 |
| 5,937,269 A * | 8/1999 | Yu et al. | ............................. | 438/4 |
| 6,238,942 B1 * | 5/2001 | Farnworth | ...................... | 438/15 |
| 7,204,008 B2 * | 4/2007 | Eldridge | ......................... | 29/593 |
| 2004/0075453 A1 | 4/2004 | Slupsky | | |
| 2004/0095736 A1 | 5/2004 | Choi et al. | | |
| 2004/0104741 A1 * | 6/2004 | Cobbley et al. | ............... | 324/765 |
| 2005/0046002 A1 * | 3/2005 | Lee et al. | ...................... | 257/678 |
| 2005/0138503 A1 | 6/2005 | Whetsel | | |
| 2005/0174131 A1 * | 8/2005 | Miller | .......................... | 324/754 |

FOREIGN PATENT DOCUMENTS

| | | |
|---|---|---|
| EP | 0295388 A2 | 12/1988 |
| EP | 1189070 A2 | 3/2002 |
| EP | 1293989 A2 | 3/2003 |

\* cited by examiner

*Primary Examiner* — Michael S Lebentritt
*Assistant Examiner* — Karen M Kusumakar

(57) ABSTRACT

A system in package (10) has a, preferably wireless, test controller (20) for testing each die (30) after it has been mounted onto the substrate of the system in package (10), and a faulty die (30) is repaired before a next die (30) is mounted onto the substrate (15). This way, the system in package (10) can be tested during the intermediate stages of its manufacturing, thus ensuring that all dies (30) function correctly before sealing the dies in the single package. Consequently, a method for manufacturing a system in package (10) is obtained that has an improved yield compared to known manufacturing methods.

14 Claims, 2 Drawing Sheets

METHOD OF MANUFACTURING A SYSTEM IN PACKAGE

Figure 1:
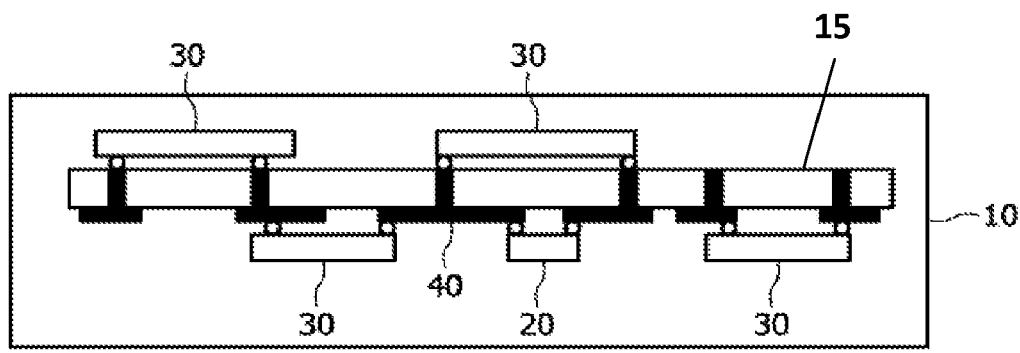

The invention relates to a method for manufacturing a (silicon) system in package.

Due to the ongoing evolution of semiconductor markets and technologies, new semiconductor products emerge in the market on a regular basis. An example of such a product gaining commercial interest is a so-called system-in-package (SiP), in which a number of separate semiconductor dies, e.g. integrated circuits (ICs), are mounted on a (passive) substrate, and enclosed in a single package. Consequently, a device is obtained that has the look and feel of a single device, in contrast to for instance a printed circuit board (PCB), where the various different dies on the PCB are easily recognizable and accessible.

Typically, any semiconductor product needs to be tested before being released into the market. Several standardized test solutions exist; for instance, recently a standard for testing systems on chip (SOCs), the IEEE 1500 standard has been agreed, which facilitates the testing of individual systems, i.e. cores in isolation or in conjunction with other systems on board an IC. Similarly, the IEEE 1149.1 standard (boundary scan test) facilitates the testing of the interconnects of the separate ICs on a PCB, as originally intended. In addition, IEEE 1149.1 is now also used to test the interconnects of ICs in isolation and to feed test data into the internal scan chains of an IC using the IEEE1149.1 boundary scan chain.

US patent application US2004/0075453 discloses a method for testing a plurality of semiconductor devices on a wafer. The semiconductor devices are conductively coupled to respective transceivers for wireless testing of the semiconductor devices. This obviates the need for physically contacting the devices, thus avoiding the risk of the contacts of the semiconductor devices being damaged by the contacting.

These prior art methods are all focussed on testing completed devices to assess whether the devices operate within predefined parameters. Unfortunately, such testing is of limited use for SiPs. The yield of a SiP manufacturing process is typically lower than the yield of a single-die manufacturing process, e.g. SoC manufacturing, and once the multiple dies of the SiP are integrated into the single package, repairs to the SiP to correct flaws detected during test are difficult to make. Consequently, a faulty SiP is usually discarded, which has a detrimental effect on the price of the known good SiPs, because the relatively low yield of the manufacturing process drives up the price of the devices that pass the testing stage.

The present invention seeks to improve the yield of the manufacturing process of a system in package.

According to an aspect of the invention, there is provided a method of manufacturing a system in package, comprising: providing a substrate; mounting a test controller on the substrate; mounting a first die on the substrate, the first die being conductively coupled to the test controller; testing the first die by providing the test controller with a plurality of test signals and communicating at least a subset of the test signals between the test controller and the first die; mounting a second die on the substrate, the second die being conductively coupled to the test controller; and testing the second die by providing the test controller with a first further plurality of test signals and communicating at least a subset of the first further plurality of test signals between the test controller and the second die.

By testing each die of the SiP separately, preferably before the next die is mounted onto the substrate, a fault in that die, or in the connections of that die with the substrate, can be corrected before packaging the various dies in a single package, thus facilitating improving the yield of the manufacturing process. Importantly, the intermediate testing process provides information about imperfections in the manufacturing process itself, as indicated by certain manufacturing steps having low yields, which means that intermediate testing provides direct information about how the manufacturing process can be improved. This information is not as easily retrievable when testing is done after the SiP assembly has been completed.

Advantageously, the method further comprises the steps of repairing the first die in case the first die failed the test and providing the test controller with the plurality of test signals for retesting the repaired first die. The repairing typically comprises repairing the original mount by replacing and/or resoldering the first die to the substrate.

In an advantageous embodiment, the method further comprises providing the test controller with a second further plurality of test signals for testing the first die in conjunction with the second die. This allows for the testing of the interactions and/or the interconnects between the first die and the second die.

Preferably, the test controller is a wireless test controller, and the test signals are provided to the test controller wirelessly, to avoid the increased risk of damage to the physical contacts of the SiP by the multiple testing steps of the method. The communications between an external tester and the test controller, and between the test controller and the dies may be compliant with accepted standards such as IEEE 1149.1 or IEEE 1500, in which case the test controller may be a wired or wireless TAP controller as mandated in those standards. Preferably, the various dies are coupled to the test controller via separate conductive paths. This simplifies the connection of a newly mounted die to the test controller during the manufacturing process.

It is pointed out that wireless testing of ICs is known per se. For instance, European patent EP1189070 discloses an arrangement for wirelessly testing an IC, and Eberle et al. have published a number of papers on the subject, e.g. in Proc. 22$^{nd}$ IEEE VLSI Test Symposium (VTS 2004). However, all this prior art is directed towards testing an IC after the completion of the manufacturing process, and do not suggest or hint at the possibility to apply such techniques to improve the manufacturing process of a multiple-die this prior art.

Figure 2:
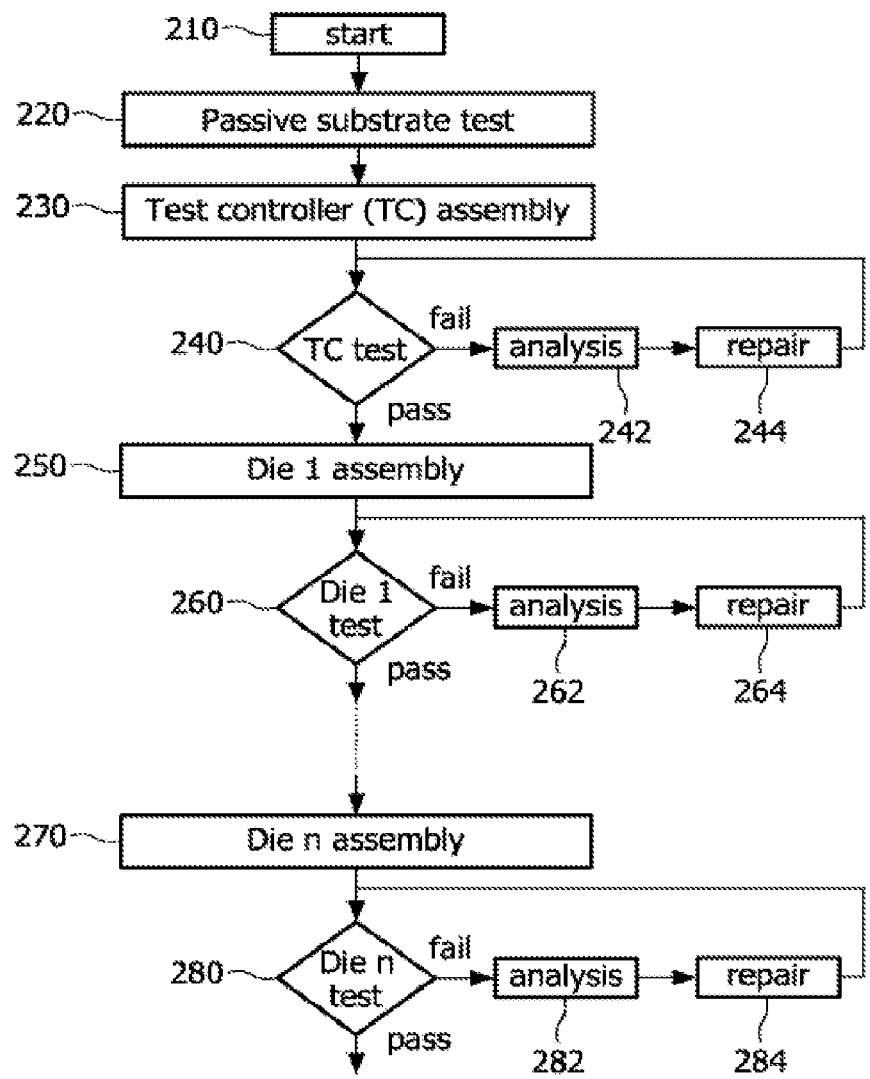
Figure 3:
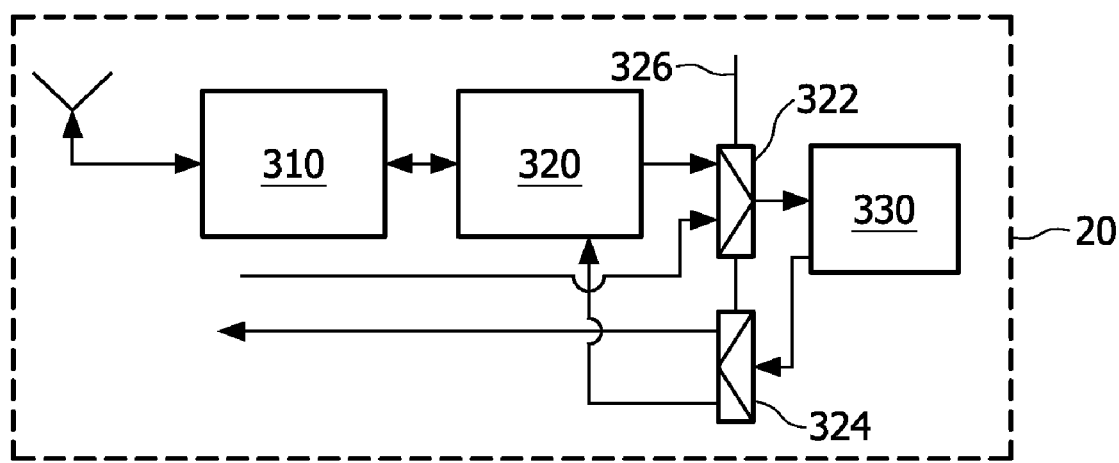

The invention is described in more detail and by way of non-limiting examples with reference to the accompanying drawings, wherein:

FIG. 1 schematically shows a system in package;

FIG. 2 depicts an embodiment of a method of manufacturing a system in package in accordance with the present invention; and FIG. 3 depicts an embodiment of a wireless test controller used in the method of the present invention.

It should be understood that the figures are merely schematic and are not drawn to scale. It should also be understood that the same reference numerals are used throughout the figures to indicate the same or similar parts.

FIG. 1 schematically depicts a silicon-based system in package (SiP) 10. The SiP 10 has a passive substrate 15, which carries a number of separate dies 30 interconnected via conductive tracks 40, e.g. metal layers, via's and combinations thereof. The dies 30 may, for instance, be any combination of digital ICs, mixed signals ICs, memories, RF transceivers, and so on. The SiP 10 further comprises a test controller 20. According to the present invention, the test controller 20 is used during the manufacture of SiP 10, as will be explained below.

FIG. 2 shows an embodiment of the method of manufacturing a SiP 10. At the start 210 of the manufacturing process, a substrate 15 is provided. In a next step 220, the substrate is tested using known substrate test methods. In the next step 230, a test controller 20 is mounted onto the substrate, and in a subsequent step 240, the test controller 20 is tested. This test may be performed by subjecting the test controller to test stimuli from an external source and collecting the test results on the external source, e.g. an automated test apparatus. These test signals (i.e. the test stimuli and test results) may be communicated wirelessly or via wired connections. Alternatively, the test controller may comprise a built-in self test (BIST) engine, in which case the test stimuli are stored in a (dedicated) on-board memory inside the test controller 20. If the test result indicates the test controller 20 failing the test, the test results are further analyzed in an analysis step 242 to locate the fault, after which the test controller 20 is repaired in step 244. After the repair, step 240 is repeated to ensure the correct functioning of the test controller 20.

In a following step 250, a first die 30 is mounted on the substrate 15 and conductively coupled to the test controller 20, after which the first die 30 is tested by the test controller 20 in step 260. In a preferred embodiment, step 260 comprises the wireless transmission of a plurality of test signals for testing the first die 30 to the test controller 20, although it is emphasized that the test signals may also be provided to the test controller 20 through wired connections. The plurality of test signals typically comprise test instructions for the test controller 20, e.g. test instructions compliant with the IEEE 1149.1 and/or IEEE 1500 standards, in which case the test controller is implemented as a test access port controller compliant with such standards. The plurality of test signals also typically comprise test stimuli for testing the first die 30, e.g. test vectors to be scanned into the scan chains of a digital IC 30.

If evaluation of the test results indicates that the first die 30 has failed its test, the first die 30 is analyzed in step 262. The analysis may be any known analysis technique. Next, the first die 30 is repaired in step 264, after which the test step 260 is repeated for the repaired first die 30. It is emphasized that the repair of a die 30 typically comprises the remounting of the die 30, although other repairs may also be feasible.

After it has been established that the step 250 of mounting the die 30 onto the substrate 15 has been successfully completed, the next die 30 is mounted to the substrate 15 in step 270 and conductively coupled to the test controller 20. The first die 30 and the next die 30 may be coupled to the test controller 20 via separate conductive paths. In this implementation, the sharing of test signal paths by the various dies 30 is minimized, which has the advantage that a fault in one of the signal paths typically only affects a single die 30, in contrast to daisy-chain based test architectures, in which all downstream dies 30 are affected by such a fault.

In step 280, which directed to testing the most recently mounted die 30, the test controller 20 is provided with a further plurality of test signals, which typically include test instructions for the test controller 20 and test data for the die under test. In case the die 30 fails the test, the die 30 is analyzed in step 282 and repaired in step 284, after which it is tested again. This process is repeated until all n dies (n being a positive integer) have been mounted onto the substrate 15 and have passed a test controlled by test controller 20, after which backend steps in the method, such as sealing the package, can be performed.

It is pointed out that the present invention is not restricted to the testing of a die 30 in isolation; for instance, the method of the present invention may comprise the step of providing the test controller with a second further plurality of test signals for testing a first die 30 in conjunction with a second die 30 to verify if the interaction between said 30 is error-free. Preferably, a final test is performed before the aggregate of the substrate 15, the test controller 20 and the dies 30 is packaged, in which all the dies 30 are tested, preferably in accordance with the IEEE 1500 standard, which is directed to testing systems on chip. Such a final test would for instance reveal errors in the interaction between the dies, which then can still be remedied before the packaging of the aggregate.

FIG. 3 shows a preferred embodiment of a test controller 20 for use in the method of the present invention. The test controller 20 comprises a radio frequency (RF) transceiver 310 coupled to a (de)modulator 320, e.g. a modem, which is coupled to a test access port (TAP) controller 330 via a multiplexer (MUX) 322. The MUX 322 is controlled by control signal line 326, which may be a test select signal that is provided to the MUX 322 via a wired connection for switching between a wired test input 340 and the wireless channel. The TAP controller 330 has an I/O channel 332, e.g. a test bus, a scan chain or a combination thereof for communicating test signals to the dies 30 under test, and has a further output coupled to a demultiplexer (DEMUX) 324 responsive to the control signal line 326 for outputting the test results from the dies under test via the (de)modulator 310 and the transceiver 300 or via a wired connection 350 depending on the state of the control signal line 326. It is emphasized that the addition of MUX 322 and DEMUX 324 is optional; in case of a wireless access only or a wired only mechanism, there obviously is no need for test signal source selection means, in which case the MUX 322, DEMUX 324, and control signal line 326 can be omitted.

The RF transceiver 310 is designed using known techniques. Typically, the power consumption of the RF transceiver 310 is optimized with the data rate and power level of its communications. Preferably, the RF transceiver 310 is designed for multi-channel and frequency hopping applications to facilitate testing of multiple SiPs in parallel, e.g. in arrangements where the transceiver 310 is connected to multiple TAP controllers 330. The transceiver 310 typically comprises an internal phase locked loop for recovering the test clock signal to be used in the testing of the SiP 10. The test clock signal and other test signals are typically but not necessarily provided to the transceiver 310 by an automated test arrangement equipped to wirelessly communicate such test data.

In a preferred embodiment, the data communication between the TAP controller 330 and the die 30 under test is performed in compliance with the IEEE 1149.1 boundary scan test standard, which is also known as the Joint Test Action Group (JTAG) standard. The TAP controller 330 is implemented as an IEEE 1149.1 standard TAP controller. This will not be elaborated on, since such TAP controllers are well-known to the skilled person. In addition, a detailed description of such a TAP controller can be found in the IEEE 1149.1 standard documentation. The JTAG signals, e.g. test reset (TRST), test clock (TCK), test data in (TDI), and test mode select (TMS), are provided wirelessly to the transceiver 310 of the test controller 20, with the demodulator 320 down-converting the signals for use inside the SiP 10 under control of the TAP controller 330. The TAP controller 330 is arranged to output a test data out (TDO) signal, e.g. the test result from the die under test, which is up converted by the (de)modulator 320 for transmission by transceiver 310 to the automated test equipment (not shown).

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of manufacturing a system in package, comprising:
   providing a substrate;
   testing the substrate;
   after testing the substrate, mounting a test controller on the substrate;
   storing self test signals in an on-board memory inside the test controller;
   testing the test controller, wherein testing the test controller comprises testing the test controller using a built-in self test engine within the test controller and the self test signals that are stored in the on-board memory inside the test controller;
   if the test controller passes the test, mounting a first die on the substrate, the first die being conductively coupled to the test controller;
   testing the first die by providing the test controller with a plurality of test signals and communicating at least a subset of the test signals between the test controller and the first die;
   after testing the first die to establish that mounting the first die on the substrate has been successfully completed, mounting a second die on the substrate, the second die being conductively coupled to the test controllers; and
   testing the second die by providing the test controller with a first further plurality of test signals and communicating at least a subset of the first further plurality of test signals between the test controller and the second die.

2. A method as claimed in claim 1, wherein the steps of providing the test controller with the plurality and the first further plurality of test signals are performed wirelessly.

3. A method as claimed in claim 1, further comprising:
   repairing the first die in case the first die failed the test; and
   providing the test controller with the plurality of test signals for retesting the repaired first die.

4. A method as claimed in claim 1, further comprising providing the test controller with a second further plurality of test signals for testing the first die in conjunction with the second die.

5. A method as claimed in claim 1, wherein communicating the test signals between the test controller and the first die and/or the second die complies with the IEEE 1149.1 standard.

6. A method as claimed in claim 1, wherein communicating the test signals between the test controller and the first die and/or the second die complies with the IEEE 1500 standard.

7. A method as claimed in claim 1, further comprising testing the test controller prior to mounting the first die on the substrate.

8. A method as claimed in claim 1, wherein the first die and the second die are respectively conductively coupled to the test controller via separate conductive paths.

9. A method as claimed in claim 1, further comprising replacing and/or resoldering the first die to the substrate in case that the first die fails the test.

10. A method as claimed in claim 4, further comprising testing interactions and/or interconnects between the first die and the second die.

11. A method as claimed in claim 1, further comprising performing a final test on the first die and the second die before packaging the substrate, the test controller, the first die, and the second die.

12. A method as claimed in claim 1, further comprising:
    if the test controller fails the test,
    analyzing a test result to locate a fault in the test controller; then
    repairing the test controller; then
    retesting the test controller to ensure a correct functioning of the test controller.

13. A method as claimed in claim 1, wherein testing the test controller comprises:
    testing the test controller using test signals from an external source; and
    collecting a test result at the external source.

14. A method as claimed in claim 13, wherein collecting the test result at the external source is performed wirelessly.

* * * * *